(12) United States Patent
Morimura et al.

(10) Patent No.: US 8,673,705 B2
(45) Date of Patent: Mar. 18, 2014

(54) METHOD OF PRODUCING THIN FILM TRANSISTOR AND THIN FILM TRANSISTOR

(75) Inventors: Taro Morimura, Chigasaki (JP); Toru Kikuchi, Chigasaki (JP); Masanori Hashimoto, Chigasaki (JP); Shin Asari, Chigasaki (JP); Kazuya Saito, Chigasaki (JP); Kyuzo Nakamura, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 275 days.

(21) Appl. No.: 12/808,397

(22) PCT Filed: Dec. 12, 2008

(86) PCT No.: PCT/JP2008/072685
§ 371 (c)(1),
(2), (4) Date: Jul. 8, 2010

(87) PCT Pub. No.: WO2009/081775
PCT Pub. Date: Jul. 2, 2009

(65) Prior Publication Data
US 2010/0301339 A1 Dec. 2, 2010

(30) Foreign Application Priority Data

Dec. 25, 2007 (JP) ................................. 2007-332774

(51) Int. Cl.
*H01L 21/84* (2006.01)
(52) U.S. Cl.
USPC .......................................... 438/166; 438/798
(58) Field of Classification Search
USPC .......................................... 438/158, 166, 798
See application file for complete search history.

(56) References Cited

U.S. PATENT DOCUMENTS

| 4,459,739 A * | 7/1984 | Shepherd et al. ............. 438/157 |
| 5,648,662 A * | 7/1997 | Zhang et al. ..................... 257/59 |
| 6,911,358 B2 * | 6/2005 | Azami et al. .................. 438/150 |
| 2002/0005905 A1 | 1/2002 | Yamazaki et al. |
| 2007/0284580 A1 * | 12/2007 | Lim et al. ........................ 257/66 |

FOREIGN PATENT DOCUMENTS

| JP | 60245124 A | 12/1985 |
| JP | 0362971 A | 3/1991 |

(Continued)

OTHER PUBLICATIONS

International Search Report dated Feb. 13, 2009.

*Primary Examiner* — William D Coleman
(74) *Attorney, Agent, or Firm* — Harness, Dickey & Pierce, PLC

(57) ABSTRACT

[Object] To provide a method of producing a thin film transistor superior in productivity and capable of preventing variation in transistor characteristics among devices from occurring to improve carrier mobility, and a thin film transistor.

Figure 1:
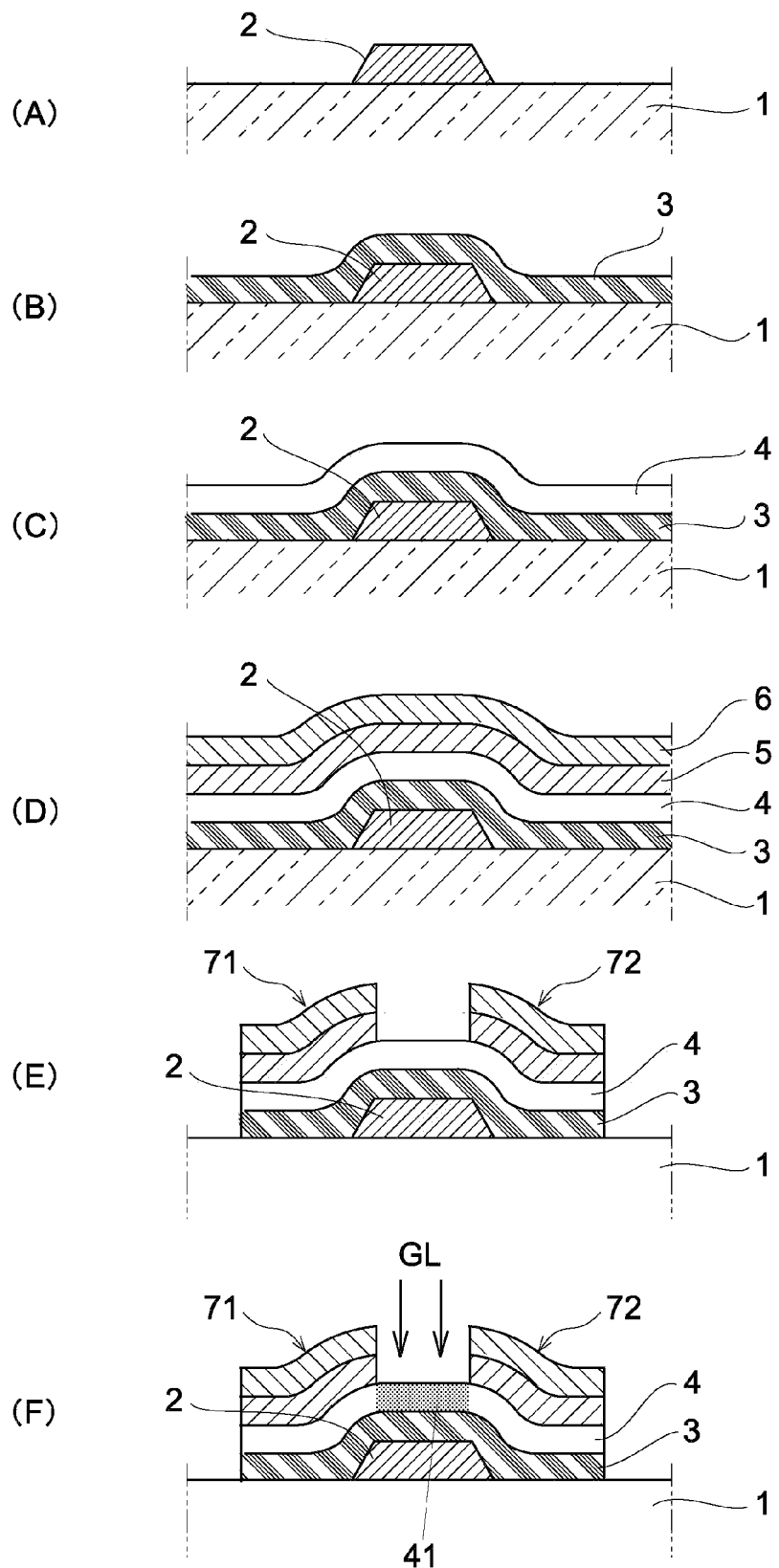

[Solving Means] In a method of producing a thin-film transistor according to the present invention, a solid-state green laser is irradiated onto a channel portion of an amorphous silicon film using a source electrode film and a drain electrode film as masks, thereby improving mobility. Since the channel portion of the amorphous silicon film is crystallized by the irradiation of the solid-state green laser, laser oscillation characteristics can be more stable than in a conventional method that uses an excimer laser. Further, laser irradiation onto a large-size substrate at uniform output characteristics in plane becomes possible, with the result that a variation in crystallinity of channel portions among devices can be avoided. Moreover, since a maintenance cycle of a laser oscillator becomes longer, a downtime cost of the apparatus can be reduced and productivity can be improved.

5 Claims, 3 Drawing Sheets

(56) References Cited

FOREIGN PATENT DOCUMENTS

| | | | |
|---|---|---|---|
| JP | 04186735 A | 7/1992 |
| JP | 10056180 A | 2/1998 |
| JP | 2007035964 A | 2/2007 |
| JP | 2007220918 A | 8/2007 |

\* cited by examiner

METHOD OF PRODUCING THIN FILM TRANSISTOR AND THIN FILM TRANSISTOR

FIELD

The present invention relates to a method of producing an amorphous-silicon-type thin film transistor having high carrier mobility and a thin film transistor.

BACKGROUND

In recent years, an active-matrix-type liquid crystal display is widely used. The active-matrix-type liquid crystal display has a thin film transistor (TFT) as a switching device for each pixel.

An amorphous-silicon-type thin film transistor having an active layer formed of amorphous silicon is known as the thin film transistor, in addition to a polysilicon-type thin film transistor having an active layer formed of polysilicon (see Patent Document 1).

The amorphous-silicon-type thin film transistor has an advantage that it can be uniformly deposited on a substrate having a relatively large area because an active layer can be produced more easily in the amorphous-silicon-type thin film transistor than in the polysilicon-type thin film transistor. However, since the amorphous-silicon-type thin film transistor has carrier mobility lower than that of the polysilicon-type thin film transistor, it has been difficult to produce a higher-definition display.

On the other hand, there is known a technique in which a channel portion of an active layer, which is located between a source electrode and a drain electrode, is crystallized by laser annealing to thereby improve carrier mobility. For example, Patent Document 1 discloses a method of producing a semiconductor device in which an active layer is modified using a KrF excimer laser (wavelength of 248 nm) to improve mobility.

Patent Document 1: Japanese Patent Application Laid-open No. Hei 10-56180 (Paragraph [0110])

SUMMARY

Problem to be solved by the Invention

However, a laser output of the excimer laser is unstable because the excimer laser uses a discharge of an active gas (mixture gas of noble gas, halogen gas, and the like), and thus the excimer laser is not adequate to uniform laser irradiation onto a large-area substrate. Accordingly, there is a problem that a variation in transistor characteristics due to a difference in crystallinity of channel portions among devices is likely to occur.

In addition, due to damages to a laser oscillating tube and an optical component that are caused by an active gas, and due to a deterioration in purity of the active gas, components are replaced more frequently in the excimer laser than in a solid medium laser. Accordingly, there is a problem that a downtime cost and a running cost of an apparatus increase, and thus it is difficult to improve productivity.

In view of the above problems, it is an object of the present invention to provide a method of producing an amorphous-silicon-type thin film transistor that is superior in productivity and capable of preventing a variation in transistor characteristics among devices from occurring to improve carrier mobility, and a thin film transistor.

Means for solving the Problem

According to an embodiment of the present invention, there is provided a method of producing a thin film transistor, including forming an insulation film on a gate electrode film. An amorphous silicon film is formed on the insulation film. An ohmic contact layer divided into a source side and a drain side is formed on the amorphous silicon film. A source electrode film and a drain electrode film are formed on the ohmic contact layer. A solid-state green laser is irradiated onto the amorphous silicon film using the source electrode film and the drain electrode film as masks.

According to an embodiment of the present invention, there is provided a thin film transistor including a gate electrode film, an insulation film, an amorphous silicon film, an ohmic contact layer, a source electrode film, a drain electrode film, and a channel portion.

The insulation film is formed on the gate electrode film. The amorphous silicon film is formed on the insulation film. The ohmic contact layer is formed on the amorphous silicon film and divided into a source and a drain. The source electrode film and the drain electrode film are formed on the ohmic contact layer. The channel portion has a microcrystalline structure, and is formed by irradiating a solid-state green laser onto the amorphous silicon film at a position between the source electrode film and the drain electrode film.

Best Modes for Carrying Out the Invention

According to an embodiment of the present invention, there is provided a method of producing a thin film transistor, including forming an insulation film on a gate electrode film. An amorphous silicon film is formed on the insulation film. An ohmic contact layer divided into a source side and a drain side is formed on the amorphous silicon film. A source electrode film and a drain electrode film are formed on the ohmic contact layer. A solid-state green laser is irradiated onto the amorphous silicon film using the source electrode film and the drain electrode film as masks.

The solid-state green laser is, for example, laser light having a green wavelength band with a center wavelength of 532 nm. The solid-state green laser can be oscillated as a second-order harmonic of a laser having a wavelength of 1064 nm emitted from a solid-state laser medium (Nd-YAG/YVO$_4$). By irradiating the solid-state green laser onto the amorphous silicon film, an irradiated region is microcrystallized. Since a region onto which the solid-state green laser is irradiated corresponds to the channel portion of the amorphous silicon film that is located between the source electrode film and the drain electrode film, carrier mobility is improved due to the microcrystallization of the channel portion.

According to the method of producing the thin film transistor described above, since the channel portion of the amorphous silicon film is microcrystallized by the irradiation of the solid-state green laser, laser oscillation characteristics can be more stable than in a conventional method that uses an excimer laser. Accordingly, laser irradiation onto a large-size substrate at uniform output characteristics in plane becomes possible, with the result that a variation in crystallinity of channel portions among devices can be avoided. Moreover, since a maintenance cycle of a laser oscillator becomes longer, a downtime cost of the apparatus can be reduced and productivity can be improved.

The solid-state green laser may be a continuous laser or a pulse laser. The source electrode film and the drain electrode film function as laser masks. Thus, it is possible to selectively anneal only the channel portion of the amorphous silicon film by spot irradiation or scan irradiation of the solid-state green laser.

An irradiation power of the solid-state green laser can be adjusted as appropriate in accordance with required carrier mobility and a type of insulation film (gate insulation film) to be used as the base film of the amorphous silicon film. For example, if the insulation film is a silicon nitride film, a laser power (energy density) is set to 100 mJ/cm$^2$ or more and 700 mJ/cm$^2$ or less, and if the insulation film is a silicon oxide film, the laser power (energy density) is set to 100 mJ/cm$^2$ or more and 700 mJ/cm$^2$ or less.

For forming the amorphous silicon film, a plasma CVD method that uses silane (SiH$_4$) as a raw material gas is typically used. When the amorphous silicon film is formed using a reactive gas of this type, residual hydrogen in the film may affect the carrier mobility. In this regard, in the present invention, the amorphous silicon film is subjected to a heat treatment at a high temperature after forming the amorphous silicon film on the insulation film and before the irradiation of the solid-state green laser onto the amorphous silicon film. Accordingly, excess hydrogen in the amorphous silicon film can be eliminated. It should be noted that an atmosphere for the heat treatment is a nitrogen atmosphere under reduced pressure, and a temperature for the heat treatment is 400° C. or more.

Further, by heat-treating the amorphous silicon film in the hydrogen atmosphere under reduced pressure after the laser modification of the amorphous silicon film, dangling bonds in the amorphous silicon film that have increased due to the laser irradiation can be eliminated, resulting in a further improvement in transistor characteristics. It should be noted that a higher temperature is more desirable in the heat treatment, for example, 400° C.

Further, according to an embodiment of the present invention, there is provided a thin film transistor including a gate electrode film, an insulation film, an amorphous silicon film, an ohmic contact layer, a source electrode film, a drain electrode layer, and a channel portion.

The insulation film is formed on the gate electrode film. The amorphous silicon film is formed on the insulation film. The ohmic contact layer is formed on the amorphous silicon film and divided into a source and a drain. The source electrode film and the drain electrode film are formed on the ohmic contact layer. The channel portion has a microcrystalline structure, and is formed by irradiating a solid-state green laser onto the amorphous silicon film at a position between the source electrode film and the drain electrode film.

DRAWINGS

Hereinafter, an embodiment of the present invention will be described based on the drawings.

Figure 2:
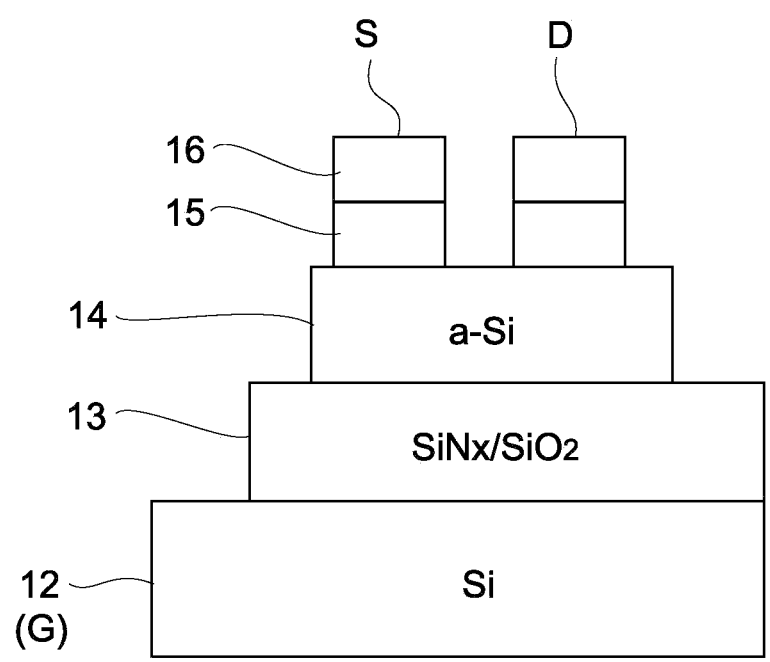
Figure 3:
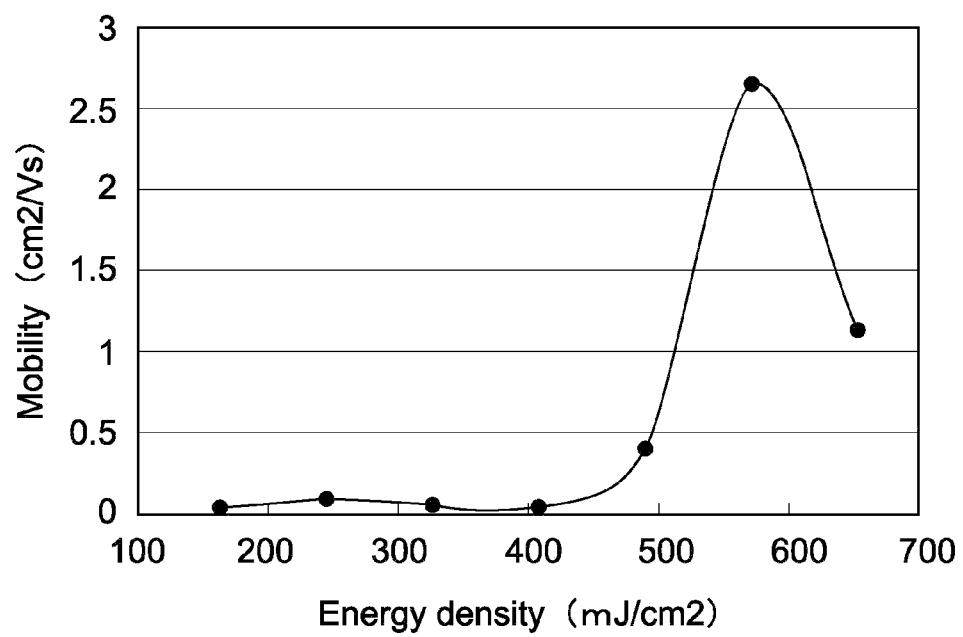
Figure 4:
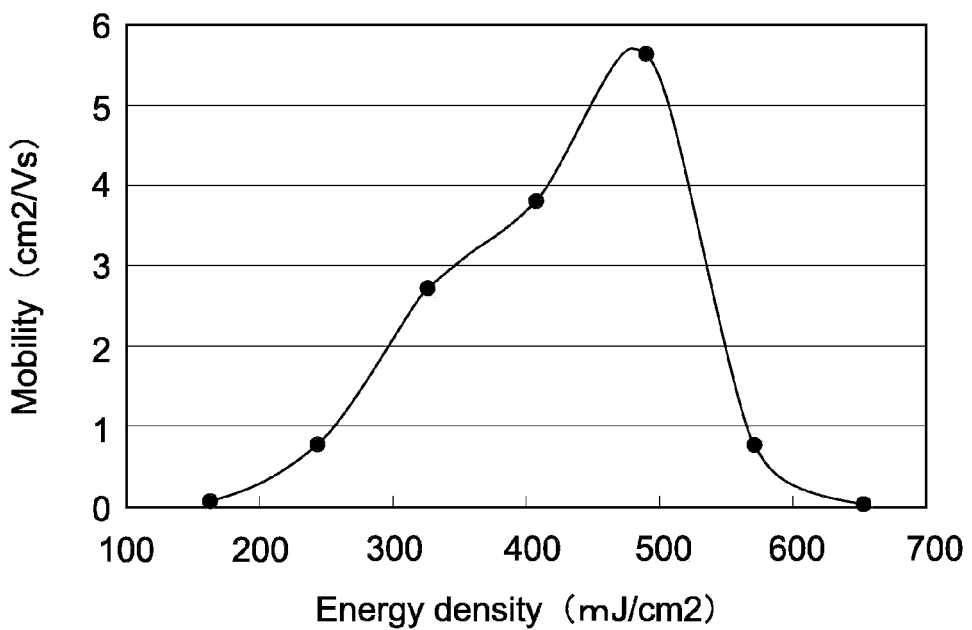

FIGS. 1(A) to 1(F) are cross sectional views of main parts in steps for explaining a method of producing an amorphous-silicon-type thin film transistor according to an embodiment of the present invention;

FIG. 2 is a schematic diagram showing a sample structure in an example of an experiment described in the embodiment of the present invention;

FIG. 3 is a graph showing a result of an experiment that is described in the embodiment of the present invention, in which a relationship between a laser power and carrier mobility in a laser annealing process when a silicon nitride film is used as a gate insulation film is shown; and FIG. 4 is a graph showing a result of the experiment that is described in the embodiment of the present invention, in which the relationship between the laser power and the carrier mobility in the laser annealing process when a silicon oxide film is used as the gate insulation film is shown.

DETAILED DESCRIPTION

First, as shown in FIG. 1(A), a gate electrode film 2 is formed on a surface of a substrate 1.

The substrate 1 is an insulation substrate, typically a glass substrate. The gate electrode film 2 is formed of, for example, a single layer metal film or a multilayer metal film of molybdenum, chrome, aluminum, and the like, and is formed by, for example, a sputtering method. The gate electrode film 2 is patterned to have a predetermined shape by a photolithography technique. The gate electrode film 2 has a thickness of, for example, 100 nm.

Next, as shown in FIG. 1(B), a gate insulation film 3 is formed on the surface of the substrate 1 such that the gate electrode film 2 is covered.

The gate insulation film 3 is formed of a silicon nitride film (SiNx), a silicon oxide film (SiO$_2$), and the like, and is formed by, for example, a CVD method. The gate insulation film 3 has a thickness of, for example, 200 nm to 500 nm.

Subsequently, as shown in FIG. 1(C), an amorphous silicon film 4 is formed on the gate insulation film 3.

The amorphous silicon film 4 corresponds to an active layer of a transistor. The amorphous silicon film 4 is formed by, for example, a plasma CVD method that uses silane (SiH$_4$) as a raw material gas. The amorphous silicon film 4 has a thickness of, for example, 50 nm to 200 nm.

After the amorphous silicon film 4 is formed, the substrate 1 is heated to carry out a dehydrogenation treatment for the amorphous silicon film 4. In the dehydrogenation treatment for the amorphous silicon film 4, the substrate 1 is loaded into a heating furnace and heated in a nitrogen atmosphere under reduced pressure at, for example, a temperature higher than or equal to 400° C. for 30 minutes. With this dehydrogenation treatment, extra hydrogen that has entered in the film during deposition of the amorphous silicon film 4 is eliminated.

Next, as shown in FIG. 1(D), an ohmic contact layer 5 and an electrode layer 6 are sequentially laminated on the amorphous silicon film 4.

The ohmic contact layer 5 is formed of, for example, a film made of low-resistance semiconductor such as n$^+$-type amorphous silicon, and the electrode layer 6 is formed of, for example, a film made of metal such as aluminum. The ohmic contact layer 5 is formed for improving an ohmic contact and adhesiveness between the amorphous silicon film 4 and the electrode layer 6. The ohmic contact layer 5 has a thickness of 50 nm, for example, and the electrode layer 6 has a thickness of 500 nm, for example.

Subsequently, as shown in FIG. 1(E), the ohmic contact layer 5 and the electrode layer 6 are patterned to have a predetermined shape to form a source and a drain such that the source and the drain are separated with the amorphous silicon film 4 intervening therebetween. The electrode layer 6 is formed so as to be divided into a source electrode film 71 and a drain electrode film 72.

Accordingly, the amorphous silicon film 4 is partially exposed to the outside at a portion between the source and the drain. Further, in addition to the step of forming the source and the drain, the amorphous silicon film 4 and the gate insulation film 3 are patterned to be divided into devices, as shown in the figure. A method for the patterning is not particularly limited. For example, a wet etching method is used, but a dry etching method may also be used.

Next, as shown in FIG. 1(F), a solid-state green laser GL is irradiated onto a channel portion 41 of the amorphous silicon film 4, which is provided between the source electrode film 71 and the drain electrode film 72.

When a predetermined voltage is applied to the gate electrode 2, the channel portion 41 of the amorphous silicon film 4 constitutes a moving region (channel portion) for carriers (electrons or holes) between the source and the drain. By an anneal effect of the laser irradiation, the channel portion 41 formed of an amorphous layer is modified into a microcrystalline layer, with the result that carrier mobility is improved as described later.

In this embodiment, laser light having a green wavelength band with a center wavelength of 532 nm is used as the solid-state green laser GL. The solid-state green laser GL can be oscillated as a second-order harmonic obtained by converting an oscillated laser having a wavelength of 1064 nm emitted from a solid-state laser medium (Nd-YAG/YVO$_4$) via a nonlinear optical crystal such as a KTP.

The solid-state green laser GL may be a continuous laser or a pulse laser. In this embodiment, a pulse laser is used. A frequency per pulse is 4 kHz, and a scan rate is 8 mm/sec. The source electrode film 71 and the drain electrode film 72 function as laser masks. Accordingly, it is possible to selectively anneal only the channel portion of the amorphous silicon film by scan irradiation of the solid-state green laser GL.

An irradiation power of the solid-state green laser can be adjusted as appropriate in accordance with required carrier mobility and a type of insulation film (gate insulation film) to be used as the base film of the amorphous silicon film. For example, if the insulation film is a silicon nitride film, a laser power (energy density) is 100 mJ/cm$^2$ or more and 700 mJ/cm$^2$ or less, and if the insulation film is a silicon oxide film, the laser power (energy density) is 100 mJ/cm$^2$ or more and 700 mJ/cm$^2$ or less.

Depending on the laser power, there is a case where dangling bonds in the amorphous silicon film (channel portion 41) increase due to damages caused by the laser irradiation, and thus carrier mobility cannot be significantly improved. In this regard, in this embodiment, by subjecting the substrate 1 to a heat treatment in a hydrogen atmosphere under reduced pressure after the laser annealing of the channel portion 41, the dangling bonds in the amorphous silicon film 4 are bound to hydrogen to thus be eliminated, resulting in a further improvement in the carrier mobility as described later.

According to this embodiment, since the solid-state green laser GL is used as a modifying laser for the channel portion 41 of the amorphous silicon film 4, laser oscillation characteristics can be more stable than in a conventional method that uses an excimer laser. Accordingly, laser irradiation onto a large-size substrate at uniform output characteristics in plane becomes possible, with the result that a variation in crystallinity of channel portions among devices can be avoided. Moreover, since a maintenance cycle of a laser oscillator becomes longer, a downtime cost of the apparatus can be reduced and productivity can be improved.

Next, a description will be given on transistor characteristics of a thin film transistor produced as described above.

FIG. 2 is a schematic configuration diagram of a sample used in an experiment. In the figure, a silicon substrate as a substrate and a gate electrode (G) is denoted by 12, a silicon nitride film or a silicon oxide film (230 nm) as a gate insulation film is denoted by 13, an amorphous silicon film (100 nm) is denote by 14, an n$^+$-type amorphous silicon (50 nm) as an ohmic contact layer is denoted by 15, an aluminum film as an electrode layer is denoted by 16, and a source electrode film and a drain electrode film that are formed by patterning the electrode layer 16 are denoted by S and D, respectively.

In the experiment, a solid-state green laser was firstly irradiated onto a region (channel portion) in the amorphous silicon film 14, which is provided between the source electrode film S and the drain electrode film D, and then a heat treatment (annealing) under an hydrogen atmosphere was carried out at 400° C. for 30 minutes. It has been confirmed that as a temperature used in this heat treatment (annealing) under the hydrogen atmosphere becomes higher, a resultant improvement effect in mobility becomes larger. A desirable heat treatment temperature is 400° C. or more.

FIGS. 3 and 4 show results obtained by examining a relationship between a laser power of the solid-state green laser and carrier mobility between the source and the drain. FIG. 3 shows an example of a sample in which the gate insulation film 13 is formed of a silicon nitride film and FIG. 4 shows an example of a sample in which the gate insulation film 13 is formed of a silicon oxide film.

In the example shown in FIG. 3, the mobility gradually increases from around a point at which the laser power exceeds 400 mJ/cm$^2$, and reaches a peak value at around 570 mJ/cm$^2$. This is probably because the channel portion is modified from an amorphous structure into a microcrystalline structure by the laser annealing, and thus resistance thereof is lowered. However, the mobility tends to decrease from a point at which the laser power exceeds 570 mJ/cm$^2$. This is probably because of a variation in crystallinity in the channel portion or melting of the channel portion. From the experiment result, it can be seen that the laser power at which the mobility of 2 cm$^2$/Vs can be obtained is in a range of 530 mJ/cm$^2$ or more to 610 mJ/cm$^2$ or less.

On the other hand, in the example shown in FIG. 4, it can be seen that the mobility increases as the laser power increases and reaches a peak value at 490 mJ/cm$^2$. However, the mobility sharply decreases from a point at which the laser power exceeds 490 mJ/cm$^2$. From the experiment result, it can be seen that the laser power at which the mobility of 2 cm$^2$/Vs can be obtained is in a range of 320 mJ/cm$^2$ or more and 530 mJ/cm$^2$ or less.

It should be noted that change in the mobility varies in accordance with a pitch of the laser, a thickness or deposition conditions of the amorphous silicon film 14, a type or deposition conditions of the insulation film, or the like. According to experiments by the inventors, the laser power at which the mobility of 2 cm$^2$/Vs or more can be obtained varies between 100 mJ/cm$^2$ or more and 700 mJ/cm$^2$ or less in accordance with the conditions described above. Therefore, a suitable laser power can be selected within this range in accordance with the conditions.

Heretofore, the embodiment of the present invention has been described. However, the present invention is not limited to the above embodiment alone, and various modifications can of course be made without departing from the gist of the present invention.

For example, in the embodiment described above, scan irradiation of the solid-state green laser is used for the laser annealing on the amorphous silicon film 4 (channel portion 41) as an example. However, the present invention is not limited thereto, and the same effect as described above can be obtained by spot irradiation of the solid-state green laser onto the channel portion 41.

The invention claimed is:

1. A method of producing a thin film transistor, comprising:
   forming an insulation film on a gate electrode film;
   forming an amorphous silicon film on the insulation film;
   forming an ohmic contact layer divided into a source side and a drain side on the amorphous silicon film, and forming a source electrode film and a drain electrode film on the ohmic contact layer; and
   modifying only a channel portion of the amorphous silicon film into a microcrystalline layer without melting the amorphous silicon film by scan-irradiating a solid-state green laser onto the amorphous silicon film within the source electrode film and the drain electrode film at an energy density of 100 mJ/cm$^2$ to 700 mJ/cm$^2$ using the source electrode film and the drain electrode film as masks.

2. The method of producing a thin film transistor according to claim 1,
   wherein the formation of the insulation film includes forming a silicon nitride film as the insulation film.

3. The method of producing a thin film transistor according to claim 1,
   wherein the formation of the insulation film includes forming a silicon oxide film as the insulation film.

4. The method of producing a thin film transistor according to claim 1, further comprising
   heat-treating the amorphous silicon film after forming the amorphous silicon film on the insulation film and before the irradiation of the solid-state green laser onto the amorphous silicon film.

5. The method of producing a thin film transistor according to claim 1, further comprising
   heat-treating the amorphous silicon film under a hydrogen atmosphere after irradiating the solid-state green laser onto the amorphous silicon film.

* * * * *